(12) United States Patent
Yang et al.

(10) Patent No.: US 8,501,500 B2
(45) Date of Patent: Aug. 6, 2013

(54) METHOD FOR MONITORING THE REMOVAL OF POLYSILICON PSEUDO GATES

(75) Inventors: Tao Yang, Beijing (CN); Chao Zhao, Kessel-lo (BE); Junfeng Li, Beijing (CN); Jiang Yan, Newburgh, NY (US); Dapeng Chen, Beijing (CN)

(73) Assignee: The Institute of Microelectronics, Chinese Academy of Science, Chaoyang District, Beijing (CN)

( * ) Notice: Subject to any disclaimer, the term of this patent is extended or adjusted under 35 U.S.C. 154(b) by 0 days.

(21) Appl. No.: 13/499,288

(22) PCT Filed: Nov. 29, 2011

(86) PCT No.: PCT/CN2011/001992
§ 371 (c)(1),
(2), (4) Date: Mar. 30, 2012

(87) PCT Pub. No.: WO2012/174695
PCT Pub. Date: Dec. 27, 2012

(65) Prior Publication Data
US 2012/0322172 A1 Dec. 20, 2012

(30) Foreign Application Priority Data
Jun. 20, 2011 (CN) .......................... 2011 1 0165279

(51) Int. Cl.
*H01L 21/66* (2006.01)

(52) U.S. Cl.
USPC ............. 438/5; 438/14; 438/585; 257/E21.53

(58) Field of Classification Search
USPC ......... 438/5, 14, 585, FOR. 101; 257/E21.53
See application file for complete search history.

(56) References Cited

U.S. PATENT DOCUMENTS

| 6,284,986 B1 * | 9/2001 | Dietze et al. .................... 177/50 |
| 7,340,372 B2 * | 3/2008 | Wilby ............................ 702/173 |
| 7,892,863 B2 * | 2/2011 | Wilby et al. .................... 438/14 |

FOREIGN PATENT DOCUMENTS

| CN | 101740518 | 6/2010 |
| CN | 101901762 | 12/2010 |

* cited by examiner

*Primary Examiner* — George Fourson, III

(57) ABSTRACT

The present invention discloses a method for monitoring the removal of a polycrystalline silicon dummy gate, comprising the steps of: forming a polycrystalline silicon dummy gate structure on a surface of a wafer; determining a measurement target and an error range of mass of the wafer; and measuring the mass of the wafer by a mass measurement tool after polycrystalline silicon dummy gate removal to determine whether the polycrystalline silicon dummy gate has been completely removed. According to the measurement method of the present invention, the full wafer may be quickly and accurately measured without requiring a specific test structure, to effectively monitor and determine whether the polysilicon dummy gate is thoroughly removed, meanwhile said measurement method gives feedback directly, quickly and accurately without causing any damage to the wafer.

8 Claims, 1 Drawing Sheet

METHOD FOR MONITORING THE REMOVAL OF POLYSILICON PSEUDO GATES

CROSS REFERENCE

This application is a National Stage Application of, and claims priority to, PCT Application No. PCT/CN2011/001992, filed on Nov. 29, 2011, entitled "METHOD FOR MONITOR THE REMOVAL OF POLYCRYSTALLINE SILICON DUMMY GATES", which claims priority to Chinese Application No. 201110165279.5,0, filed on Jun. 20, 2011. Both the PCT application and the Chinese application are incorporated herein by reference in their entireties.

FIELD OF THE INVENTION

The present invention relates to a method for manufacturing a semiconductor device, particularly to a method for monitoring the removal of polycrystalline silicon dummy gates in the device manufacturing process.

BACKGROUND OF THE INVENTION

The successful implementation of high-k metal-gate (HKMG) in the 45 nm technology node has made it a necessary step in the key process flow for the sub-30 nm technology node. Intel, who has committed to a high-k metal-gate-last approach, is now the leader in mass production of 45 nm and 32 nm chips. And former IBM alliances such as Samsung, TSMC and Infineon have recently switched from the high-k gate-first approach to the gate-last approach.

In the gate last approach, after high temperature ion-implant anneal, the polycrystalline silicon dummy gate should be removed and then a metal gate electrode is formed by a filling process, as shown in FIG. 1. An insulating layer 2, polycrystalline silicon dummy gates 3, gate sidewalls 4, and interlayer dielectric layer (ILD) 5 are sequentially formed on substrate 1, as shown in FIG. 1A. The polycrystalline silicon dummy gates 3 are removed to form gate openings trench 6, and a metal gate electrode material is then filled, as shown in FIG. 1B. The polycrystalline silicon gate sidewalls 4 is a spacer made of a material of silicon oxide or silicon nitride, and the insulating layer 2 below the polycrystalline silicon gates is formed of deposited high-k material, or the material of silicon oxide or silicon oxynitride. At present, three technologies exist for removing the polycrystalline silicon dummy gates. They are dry etching, wet chemical etching and dry-wet mixed etching. The wet chemical etching and dry-wet etching processes have become the popular methods in the related experiments and reports.

After removing the polycrystalline silicon dummy gates 3, an effective monitoring method is required to determine whether the polycrystalline silicon has been thoroughly removed. Because polycrystalline silicon residual will have a big negative impact on the device performance. The process is a complex process for 32 nm and even smaller technology node. How to effectively monitor the removal of the polycrystalline silicon dummy gates 3 has not been reported in the prior art. The most direct method is to see the cross section using scanning electron microscope after removing the dummy gates 3. But such a method is a destructive method, and feedback is often slow, so this method cannot be directly used to effectively monitor dummy gate removal process, especially in the mass production process. Optical detection means is readily used in the IC industry to monitor the module process. With the technology nodes further scaling down, device structure and film stack composed of thinner films have become more complex. The traditional optical detection methods are not able to quickly and accurately monitor the fine trench structure after dummy gate removal. Therefore, a direct, quick, accurate, and non-damaging monitor method for dummy gate removal process is needed in order to determine whether the polycrystalline silicon is thoroughly removed or not.

SUMMARY OF THE INVENTION

In consideration of the aforementioned, the present invention discloses a method for monitoring the removal of a polycrystalline silicon dummy gate, to quickly, accurately, and effectively monitor and determine whether the polycrystalline silicon dummy gate has been thoroughly removed, and in the meantime, the method leads to no damage to the wafer.

The present invention discloses a method for monitoring the removal of a polycrystalline silicon dummy gate, comprising the steps of: forming a polycrystalline silicon dummy gate structure on a surface of a wafer; determining a measurement target and an error range of the mass of the wafer; after removing the polycrystalline silicon dummy gate, measuring the mass of the wafer by a mass measurement tool to determine whether the polycrystalline silicon dummy gate has been completely removed.

The present invention also discloses a method for monitoring the removal of a polycrystalline silicon dummy gate, comprising the steps of: forming a polycrystalline silicon dummy gate structure on a surface of a wafer; determining a measurement target and an error range of a difference of mass of the wafer; measuring the mass of the wafer by a mass measurement tool to determine a previous value of the wafer mass; measuring the wafer mass by a mass measurement tool after removing the polycrystalline silicon dummy gate to determine a post value of the wafer mass in order to determine whether the polycrystalline silicon has been completely removed.

In one example of the present invention, an insulating layer is disposed below the polycrystalline silicon dummy gate, and said insulating layer includes a high-k material, silicon oxide or silicon oxynitride.

In another example of the present invention, said insulating layer and said polycrystalline silicon dummy gate are removed simultaneously.

In another example of the present invention, the mass or mass difference and an error range of a sample wafer from which the polycrystalline silicon dummy gate is completely removed are obtained by a design of experiments (DOE).

In another example of the present invention, when the wafer mass exceeds the error range and it suggests that the polycrystalline silicon has not been completely removed, a rework process is performed.

In another example of the present invention, when the difference between the previous value and the post value of the wafer mass exceeds the error range of the difference of the wafer mass, and it suggests that the polycrystalline silicon has not been completely removed, a rework process is performed.

The mass measurement tool may be a mechanical precision balance, an electronic precision balance, or a semi/fully automatic electro-optical projection damping overweight precision balance.

This patent discloses two lines for monitoring the removal of the polycrystalline silicon dummy gate, and a method to examine if the dummy gate is thoroughly removed or not by detecting the wafer mass or mass difference. According to the measurement method of the present invention, the full wafer may be quickly and accurately measured without a specific test structure, to effectively monitor and determine whether the polycrystalline silicon dummy gate is thoroughly removed, meanwhile said measurement method gives a feedback quickly and accurately without causing any damage to the wafer.

The above examples of the present invention as well as other examples not listed herein are satisfied within a range of the independent claims of the present invention. The embodiments of the present invention are defined in the independent claims and the specific features are defined in the dependent claims.

BRIEF DESCRIPTION OF THE DRAWINGS

The technical solutions of the present invention are illustrated in detail with reference to the drawings.

DETAILED DESCRIPTION OF THE EMBODIMENTS

The features of the technical solutions disclosed in the present invention and their technical effects are described in detail with reference to the drawings in combination with the illustrative embodiments. The invention discloses a method to monitor of the removal of polycrystalline silicon dummy gates in a gate last process by a wafer mass measurement technique. It should be pointed out that like reference signs indicate like structures.

Figure 1A:
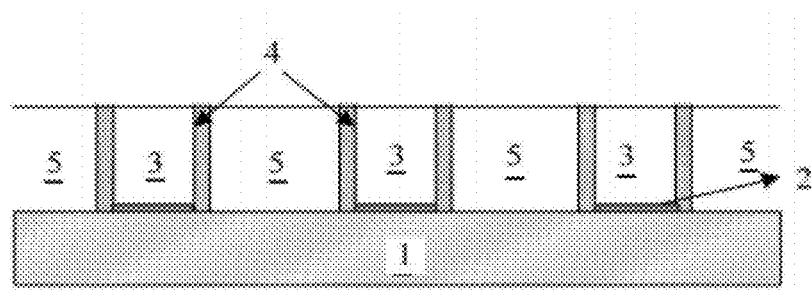
FIG. 1 shows a schematic diagram of a gate last process.
Figure 1B:
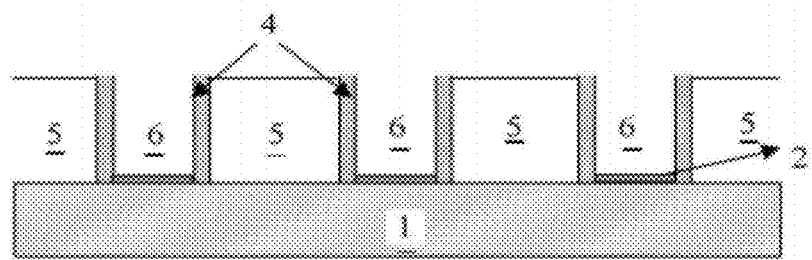

As illustrated in FIG. 1, the mass of a wafer is significantly reduced after removing polycrystalline silicon dummy gates. Based on this principle, the present invention monitors whether the polycrystalline silicon dummy gates have been thoroughly removed by measuring the mass of the wafer from which the dummy gates have been removed, to determine whether the process is qualified. The detail steps for the measuring method are illustrated in the embodiments below.
Embodiment 1

An insulating layer 2, polysilicon dummy gates 3, gate sidewalls 4, and an interlayer dielectric layer (ILD) 5 are sequentially formed on substrate 1, as shown in FIG. 1. Then, the polycrystalline silicon dummy gates 3 are removed to form gate openings trench 6. It can be seen from FIG. 1 that the mass of the films on the wafer (that is, the sum of mass of the films of ILD5 on the surface of the wafer, sidewalls 4 and gate openings trench 6 in ILD5) will be significantly reduced after removing the polycrystalline silicon dummy gates 3. Thus, by monitoring the wafer mass, it can be determined whether the polycrystalline silicon dummy gates have been thoroughly removed. This method is a direct measurement technique, which results no damage for the wafer and have a high measuring efficiency. Hence the method is appropriate to effectively monitor the process of the removal of the polycrystalline silicon dummy gates.

Specifically, the method for monitoring the removal of polycrystalline silicon dummy gates in the gate last process post with an embodiment of the present invention, comprises the steps of:

First, a polycrystalline silicon dummy gate structure is formed on the surface of a wafer. As shown in FIG. 1, the polycrystalline silicon dummy gate structure is formed on the surface of the wafer. That is, an insulating layer 2, polycrystalline silicon dummy gates 3, gate sidewalls 4, and an interlayer dielectric layer (ILD) 5 are sequentially formed on the substrate 1. Then, the polycrystalline silicon dummy gates 3 are removed to form gate openings trench 6. The substrate 1 may include bulk silicon, silicon on insulator (SOI), SiGe, and GaAs, or any other semiconductor materials. The insulating layer 2 may comprise silicon oxide, silicon oxynitride, or a high-k material such as $HfO_2$, $TiO_2$, $Ta_2O_5$, HfAlN or Barium Strontium Titanate (BST) and the like. The gate sidewalls 4 may comprise a material having a greater etching selectivity ratio with the polycrystalline silicon dummy gates 3, for example, silicon nitride. ILDs 5 generally comprise a low intensity or low-K material such as spin-coated boron-phosphorosilicon oxidete glass (BPSG), porous silicon oxide and the like. The polycrystalline silicon dummy gates 3 are generally formed by chemical vapor deposition (CVD), and materials of different crystalline states are obtained by controlling the temperature of CVD. For example, polycrystalline silicon is obtained at a temperature above 625° C.

Second, the measurement target and the error range of the mass of the wafer after removing the polycrystalline silicon dummy gates are determined. A polycrystalline silicon dummy gate structure may be formed on a wafer for testing purpose (i.e., a spare wafer that will not be finally cut into chips) according to the flow chart. The mass of a wafer of a certain product model from which polycrystalline silicon dummy gates are removed completely (a destructive SEM or TEM test may be performed on a sample wafer to determine whether polycrystalline silicon dummy gates are completely removed, and such an experimental step may be called design of experiments DOE), i.e. standard wafer mass, is determined, and the polycrystalline silicon dummy gates 3 shall have a thickness of 0. After measuring multiple batches of wafers, a range of the mass of the wafer from which the polycrystalline silicon dummy gates are completely removed, (i.e. the mass of the residual wafer) is obtained. Then, a measurement target and an error range of the mass of the residual wafer are reasonably defined based on the above results. For example, the mass of a residual structure obtained by completely removal polycrystalline silicon dummy gates 3 from a wafer of a certain product model is 151.203 g, or less or larger by 9.751 g. Then the criterion for determining if the polycrystalline silicon dummy gates are completely removed without over etching is that the mass of the residual structure is 151.203±9.751 g. The purpose for a DOE experiment is to find the range of mass of residual wafer with poly dummy gates thoroughly removed.

Then, polycrystalline silicon dummy gates are removed, and following a wafer dry process. The polycrystalline silicon dummy gates 3 may be removed by dry etching, such as fluorocarbon plasma etching, by wet etching using etching solution, such as KOH or TAMH, or by mixed etching combining dry etching and wet etching. Parameters, such as flow rate, concentration, or pressure of the materials for etching are reasonably selected to control etching speed so that polycrystalline silicon dummy gates 3 can be completely etched during a preset period of time. The wafer dry process may be a high-speed spin dry at a certain temperature in $N_2$ atmosphere, or the wafer is dried based on the Marangoni technology.

Next, the mass of the wafer is measured with a mass measurement tool to determine whether the polycrystalline silicon has been completely removed. The mass measurement tool is preferably a precision instrument such as a mechanical precision balance, an electronic precision balance, or a semi/fully automatic electro-optical projection damping overweight precision balance. If the mass of the residual wafer falls within the error range (the tolerance range has been determined at step 2, e.g., ±9.715 g), it may be determined that the polycrystalline silicon dummy gates 3 have been removed completely by etching. If the mass of the wafer does not fall within the error range, it may be determined that the polycrystalline silicon dummy gates 3 have not been removed completely, and the wafer should be re-worked, that is, this batch of samples will be sent back to the processing line for a second etching.

In the above-mentioned embodiment of the present invention, the mass variation range after complete removal of the polycrystalline silicon dummy gates is obtained via design of experimental, then the wafer mass of a product is measured by a mass measurement tool, to determine whether the polycrystalline silicon dummy gates 3 have been completely removed. Such measurement and the method of removing polycrystalline silicon dummy gates in gate last route can avoid destructive tests using SEM or TEM on a large quantity of products, thereby improving testing efficiency and saving cost.

Embodiment 2

The method for monitoring the removal of polycrystalline silicon dummy gates in the gate last process in accordance with another embodiment of the present invention, comprises the steps of:

First, a polycrystalline silicon dummy gate structure is formed on a surface of a wafer. As shown in FIG. 1, a polycrystalline silicon dummy gate structure is formed on the surface of the wafer, that is, an insulating layer 2, polycrystalline silicon dummy gates 3, gate sidewalls 4, and interlayer dielectric layer (ILD) 5 are sequentially formed on a substrate 1. Then, the polycrystalline silicon dummy gates 3 are removed to form gate openings trench 6.

Second, a measurement target and an error range are determined. Polycrystalline silicon dummy gates may be formed on a wafer for testing purpose (i.e., a spare wafer which will not be finally cut into chips) according to the flow chart. Then a difference between the mass of a wafer of a certain product model (a destructive SEM or TEM test may be performed to a sample wafer to determine whether polycrystalline silicon dummy gates are completely removed) before and after dummy gate removal process, that is, wafer mass standard error, is determined by design of experiments (DOE) and by taking mass measurement means. After the polycrystalline silicon dummy gates are completely removed, the polycrystalline silicon dummy gates 3 shall have a thickness of 0. After measuring multiple batches of wafers, a range of the mass difference is obtained. Then, a measurement target and an error range of the mass difference of the wafer are reasonably defined based on the above results. For example, the mass difference of a wafer of a certain product model before and after removing the dummy gates 3 completely is 12.450 g, or less or larger by 1.017 g. Then the criterion for determining whether the polycrystalline silicon dummy gates have been completely removed without over etching is that the mass difference of the wafer before and after removing the polycrystalline silicon dummy gates 3 is 12.450±1.017 g.

Then, before the polycrystalline silicon dummy gates 3 are removed, the wafer mass is measured by a mass measurement tool to obtain a previous value M1 of the wafer mass. For example, the mass M1 of a certain batch of wafers is 160.479 g before the removal.

Next, the polycrystalline silicon dummy gates are removed, and following with wafer dry process. The polycrystalline silicon dummy gates 3 may be removed by dry etching such as fluorocarbon plasma etch, by wet etching using etching solution such as KOH or TAMH, or by mixed etching which combines dry etching and wet etching. Parameters, such as flow rate, concentration, or pressure of the materials for etching are reasonably selected to control etching speed such that polycrystalline silicon dummy gates 3 can be completely etched during a predetermined period of time.

Thereafter, the mass of the wafer was measured after the removal of polycrystalline silicon dummy gates, that is, the afterward value M2 of wafer mass, is measured by a mass measurement tool. The mass difference between the wafer, M1 minus M2, is automatically computed by a tool, in order to determine whether the polycrystalline silicon has been completely removed, and/or over etching has happened. For example, if the afterward value M2 for the above batch of wafers is 148.762 g, and then the mass difference is 11.717 g. If the mass difference of the wafer falls within the error range (the tolerance range has been determined at step 2), it may be decided that the polycrystalline silicon dummy gates 3 have been removed completely without over etching. If the mass difference of the wafer falls out of the error range, it may be decided that the polycrystalline silicon dummy gates 3 have not been removed completely, and the wafer should be rework, that is, this batch of samples will be sent back to the processing line for a second etching.

Embodiment 3

Similar to embodiment 1 or 2, the distinction only lies in whether the insulating layer 2 is a gate dielectric layer in the gate last process. If the insulating layer 2 includes a high-k material and is used as a gate dielectric layer in the gate last process, then in the monitoring method disclosed in the present invention, the insulating layer 2 will not be removed after the removal of polycrystalline silicon dummy gates 3, and it will be reserved. The monitoring method is the same. However, if the insulating layer 2 is merely used as an etch stop layer for the polycrystalline silicon gates 3, that is, the material for the insulating layer 2 being a common insulating dielectric material such as silicon dioxide, the insulating layer 2 shall be removed together with the polycrystalline silicon dummy gates 3, thus the above two embodiments of the present invention shall be modified accordingly.

Specifically, the varied monitoring methods of embodiment 3 with respect to embodiment 1 comprise:

1) The mass of a wafer of a certain product model after the polycrystalline silicon dummy gates 3 and the insulating layer 2 are completely removed is measured by a mass measurement monitoring method. After measuring multiple batches of wafers, a range of the mass after the dummy gates 3 and the complete removal of insulating layer 2, is obtained. A measuring target and a tolerance range of the wafer mass after the polycrystalline silicon dummy gates removal are defined based on the above result.
2) The polycrystalline silicon dummy gates 3 and the insulating layer 2 are removed by dry etching, wet etching, or dry-wet mixed etching, and then the wafer is dried.
3) The wafer mass is measured by a mass measurement tool. If the wafer mass falls within a tolerance range (the tolerance range has been determined at step 1, it may be determined that the polycrystalline silicon dummy gates 3 and the insulating layer 2 have been removed completely; if the wafer mass falls out of the tolerance range, it may be determined that the polycrystalline silicon dummy gates 3 and the insulating layer 2 have not been removed completely; and the process conditions should be adjusted or reworked.

Accordingly, the variation of Embodiment 2 is provided as follows:

1) A mass difference of a wafer for a certain product model before and after the polycrystalline silicon dummy gates 3 and the complete removal of the insulating layer 2 is measured by using a mass measurement monitoring method. After measuring multiple batches of wafers, a range of the mass difference before and after the complete removal of dummy gates 3 and the insulating layer 2 is obtained. A measuring target and a tolerance range of the mass difference of the wafer before and after the dummy gates 3 and the insulating layer 2 removal are reasonably defined based on the above result.

2) Before the polycrystalline silicon dummy gates 3 and the insulating layer 2 removal, the wafer mass is measured by a mass measurement tool to obtain a previous value of the wafer mass.

3) The polycrystalline silicon dummy gates 3 and the insulating layer 2 are removed by dry etching, wet etching, or dry-wet mixed etching, and drying the wafer.

4) The wafer mass is measured by a mass measurement tool to obtain a post value of the wafer mass, and a mass difference is automatically computed by a tool. If the difference of the wafer mass falls within a tolerance range (the tolerance range has been determined at step 1), it may be determined that the polycrystalline silicon dummy gates 3 and the insulating layer 2 have been removed completely by etching. If the difference of the wafer mass falls out of the tolerance range, it may be determined that the polycrystalline silicon dummy gates 3 and the insulating layer 2 have not been removed completely. Then the process conditions should be reworked.

By using the measuring and etching methods disclosed in the present invention, destructive tests using SEM or TEM on a large amounts of products can be avoided, testing efficiency can be improved, and the cost can be saved. In addition, it can be used to simultaneously determine whether insufficient etching or over etching occurs, thus the test can be more convenient and efficient, and the product yield and reliability are greatly improved.

Although the present invention is described with reference to one or more illustrative embodiments, it may be appreciated by those skilled in the art that various appropriate variations and equivalent modes may be made to the structure of the device without departing from the scope of the present invention. Furthermore, many modifications that may be applicable to specific situations or materials can be made from the teachings disclosed above without departing from the scope of the present invention. Therefore, the purpose of the present invention is not to define the specific embodiments disclosed as the preferred embodiments for implementing the present invention, the disclosed device structure and the manufacturing method will include all embodiments falling within the scope of the present invention.

What is claimed is:

1. A method for monitoring the removal of a polycrystalline silicon dummy gate, comprising the steps of:
    forming a polycrystalline silicon dummy gate structure on a surface of a wafer;
    determining a measurement target and an error range of a mass of the wafer; and
    measuring the mass of the wafer by a mass measurement tool after dummy gate removal to determine whether the polycrystalline silicon dummy gate has been completely removed,
    wherein an insulating layer is disposed below the polycrystalline silicon dummy gate, and the insulating layer comprises a high-k material, silicon oxide, or silicon oxynitride, and wherein said insulating layer and said polycrystalline silicon dummy gate are removed simultaneously.

2. A method for monitoring the removal of a polycrystalline silicon dummy gate, comprising the steps of:
    forming a polycrystalline silicon dummy gate structure on a surface of a wafer;
    determining a measurement target and an error range of a difference of a mass of the wafer; measuring the mass of the wafer by a mass measurement tool to determine a previous value of the wafer mass; and
    measuring the wafer mass by a mass measurement tool after removing the polycrystalline silicon dummy gate to determine a post value of the wafer mass in order to determine whether the polycrystalline silicon has been completely removed,
    wherein an insulating layer is disposed below the polycrystalline silicon dummy gate, and the insulating layer comprises a high-k material, silicon oxide, or silicon oxynitride, and wherein said insulating layer and said polycrystalline silicon dummy gate are removed simultaneously.

3. The method according to claim 1, wherein the mass or mass difference and an error range of a sample wafer after the polycrystalline silicon dummy gate complete removal are obtained by a design of experiments (DOE).

4. The method according to claim 1, wherein when the wafer mass exceeds the error range and the polycrystalline silicon has not been completely removed, a rework process is employed.

5. The method according to claim 2, wherein when a difference between the previous value and the post value of the wafer mass exceeds the error range of the wafer mass difference and the polycrystalline silicon has not been completely removed, a rework process is employed.

6. The method according to claim 1, wherein said mass measurement tool is a mechanical precision balance, an electronic precision balance, or a semi/fully automatic electro-optical projection damping overweight precision balance.

7. The method according to claim 2, wherein the mass or mass difference and an error range of a sample wafer after the polycrystalline silicon dummy gate complete removal are obtained by a design of experiments (DOE).

8. The method according to claim 2, wherein said mass measurement tool is a mechanical precision balance, an electronic precision balance, or a semi/fully automatic electro-optical projection damping overweight precision balance.

* * * * *